United States Patent
Boettcher et al.

(10) Patent No.: US 9,846,181 B2
(45) Date of Patent: Dec. 19, 2017

(54) FLUX-GATE CURRENT SENSOR WITH ADDITIONAL FREQUENCY MEASURING

(71) Applicant: VACUUMSCHMELZE GMBH & CO. KG, Hanau (DE)

(72) Inventors: Steffen Boettcher, Kahl (DE); Holger Schwenk, Hanau (DE)

(73) Assignee: VACUUMSCHMELZE GMBH & CO. KG, Hanau (DE)

( * ) Notice: Subject to any disclaimer, the term of this patent is extended or adjusted under 35 U.S.C. 154(b) by 161 days.

(21) Appl. No.: 14/812,163

(22) Filed: Jul. 29, 2015

(65) Prior Publication Data

US 2016/0033555 A1   Feb. 4, 2016

(30) Foreign Application Priority Data

Jul. 31, 2014   (DE) .................. 10 2014 215 109

(51) Int. Cl.
*G01R 15/18*   (2006.01)
*G01R 15/20*   (2006.01)
(Continued)

(52) U.S. Cl.
CPC ......... *G01R 15/207* (2013.01); *G01R 15/185* (2013.01); *G01R 19/10* (2013.01)

(58) Field of Classification Search
CPC .... G01R 15/18; G01R 15/183; G01R 15/185; G01R 15/207; G01R 19/10; G01R 19/20;
(Continued)

(56) References Cited

U.S. PATENT DOCUMENTS 5,008,612 A * 4/1991 Otto ................. H01F 38/32
                                                                 323/356
5,696,441 A * 12/1997 Mak .................. G01R 21/133
                                                                 324/115

(Continued)

FOREIGN PATENT DOCUMENTS

DE   68924112 T2   4/2015

OTHER PUBLICATIONS

LEM Components:Galvanisch getrennte Strom-und Spannungswandler-Eigenschaften-Anwendungen-Dimensionierung, Ausgabe Mai 2006, 3.Auflage—Firmenschrift.—Christopher Rauscher: Grundlagen der Spektrumanalyse, Rhode & Schwarz, 1. Auflage 2000—Firmenschrift.

*Primary Examiner* — Arleen M Vazquez
*Assistant Examiner* — Steven Yeninas
(74) *Attorney, Agent, or Firm* — Dickinson Wright PLLC (57) ABSTRACT

A current sensor arrangement for measuring an effective primary current in a primary conductor having a magnetic core for magnetic coupling of the primary conductor to a secondary conductor and a controlled voltage source connected to the secondary conductor and configured to apply a voltage with adjustable polarity to the secondary conductor so that a secondary current passes through the secondary conductor. A measurement and control unit is coupled to the secondary conductor and configured to generate a measuring signal that represents the secondary current, to continuously detect the occurrence of magnetic saturation in the core, and to reverse the polarity of the voltage upon the detection thereof in order to reverse magnetization of the core. Furthermore, the measurement and control unit is configured to evaluate a spectrum of the measuring signal and determine a frequency of a current passing through the primary conductor based on the spectrum.

12 Claims, 6 Drawing Sheets

(51) Int. Cl.
*G01R 19/20* (2006.01)
*G01R 19/10* (2006.01)

(58) Field of Classification Search
CPC .... G01R 31/025; G01R 23/16; G01R 23/163;
G01R 23/18; G01R 31/027; G01R
31/343; G01R 33/383; G01R 33/385;
G01R 33/3873; G01R 33/3875
USPC ... 324/76.19, 76.41, 16.21, 117 R, 126, 127,
324/128, 76.21, 239, 241
See application file for complete search history.

(56) References Cited

U.S. PATENT DOCUMENTS

| | | | | |
|---|---|---|---|---|
| 7,221,142 B2* | 5/2007 | Murray | ............ | G01R 15/146 |
| | | | | 324/117 R |
| 2009/0315536 A1* | 12/2009 | Koch | ............ | G01R 19/20 |
| | | | | 324/117 R |
| 2011/0006779 A1* | 1/2011 | Kobayashi | ............ | G01R 15/185 |
| | | | | 324/537 |
| 2012/0091996 A1* | 4/2012 | Koch | ............ | G01R 19/20 |
| | | | | 324/117 R |
| 2014/0159704 A1* | 6/2014 | Rathsmann | ............ | G01R 15/183 |
| | | | | 324/117 R |
| 2014/0320112 A1* | 10/2014 | Nodera | ............ | G01R 15/183 |
| | | | | 324/127 |

* cited by examiner

FLUX-GATE CURRENT SENSOR WITH ADDITIONAL FREQUENCY MEASURING

CROSS-REFERENCE TO RELATED APPLICATIONS

This application claims benefit of German Patent Application No. 10 2014 215 109.0, filed on Jul. 31, 2014, which is hereby incorporated by reference in its entirety.

TECHNICAL FIELD

The present specification relates to a flux-gate current sensor that additionally provides the capability of a simple measurement of frequency, for example, a differential current sensor for use in residual-current circuit breakers.

BACKGROUND

So-called "direct imaging current sensors" are known for their contactless and therefore potential-free measuring of the electric currents in a conductor. These sensors detect the magnetic flux caused by the currents (for example, with a Hall sensor) in a gapped magnetic circuit and generate a signal proportional to the current strength. These sensors are very economical but have relatively low accuracy. Direct imaging current sensors are so-called "open-loop current sensors", which do not comprise closed control circuits.

Furthermore, so-called "closed-loop current sensors" are known; in these, an opposing magnetic field with the same magnitude as the magnetic field of the current to be measured is continuously generated with the aid of a closed control circuit so that a complete magnetic field compensation is constantly brought about and the magnitude of the current to be measured can be determined from the parameters for generating the opposing field. Closed-loop current sensors therefore belong to the class of compensation current sensors.

Special types of compensation current sensors that do not contain closed control circuits are so-called "flux-gate sensors". These current sensors comprise a magnetic core with a primary and a secondary winding. A compensation of the magnetic field, which is generated by the current to be measured that passes through the primary winding (i.e., the primary current), takes place only in certain time intervals of a measuring cycle, wherein the magnetic core is driven, in each measuring cycle, with the aid of the secondary winding into positive and negative saturation. Very precise current measurement is thus possible with the aid of such sensors because the influence of the hysteresis of the magnetic core can be eliminated by using appropriate signal processing. For this reason, flux-gate current sensors are also suitable for differential current measurement. In this case, the primary winding is composed of at least two partial windings (with opposing winding direction); the difference of the currents, which pass through the two partial windings, is measured. In the simplest case the two partial windings are straight lines (oriented antiparallel) that run through a ring core. In the case of more than two partial windings, the currents in the partial windings are subtracted or added as functions of the direction of the current flow and the orientation of the particular partial winding.

Differential current sensors can be used in residual-current current devices (also referred to as "residual-current circuit breakers"). In some applications, it is necessary to check whether the differential current (residual current) to be measured has a direct current component (DC component). However, for efficient calculation of the DC component, information about the frequency of the alternating current component (AC component) is necessary. For example, to secure charging stations for electrical vehicles, residual-current sensors capable of determining DC and AC components are necessary (cf. standard IEC 62752, "In-Cable Control and Protective Device for Mode 2 Charging of Electric Road Vehicles"). There is thus a need for current sensors to be capable of determining the frequency of the AC component of the current to be measured in a simple manner.

SUMMARY OF THE INVENTION

A current sensor arrangement for measuring an effective primary current in a primary conductor is described. In accordance with a first example of the invention, the current sensor arrangement comprises a magnetic core for the magnetic coupling of the primary conductor to a secondary conductor and a controlled voltage source that is connected to the secondary conductor and that is configured to apply a voltage with adjustable polarity to the secondary conductor so that a secondary current passes through the secondary conductor. A measurement and control unit is coupled to the secondary conductor and is configured to generate a measuring signal that represents the secondary current, to continuously detect the occurrence of magnetic saturation in the core, and to reverse the polarity of the voltage upon the detection thereof in order to reverse magnetization of the core. Furthermore, the measurement and control unit is configured to evaluate a spectrum of the measuring signal and determine a frequency of a current passing through the primary conductor based on the spectrum.

Furthermore, a method for measuring an effective primary current through a primary conductor is described, wherein the primary conductor is magnetically coupled by a magnetic core to a secondary conductor. In accordance with one example of the invention, the method comprises applying a voltage to the secondary conductor so that a secondary current passes through the secondary conductor and generating a measuring signal that represents the secondary current. The occurrence of magnetic saturation in the core is continuously checked for and the polarity of the voltage is reversed upon detection thereof in order to reverse the magnetization of the core. Furthermore, the method comprises the evaluation of a spectrum of the measuring signal and the determination of the frequency of a current passing through the primary conductor based on the spectrum of the measuring signal.

The primary conductor may comprise first and second parts through which first and second primary currents respectively flow in such a manner that the magnetic field strength generated by the primary conductor, and thus the effective primary current, corresponds to the difference of the primary currents.

BRIEF DESCRIPTION OF THE FIGURES

The invention can be better understood with reference to the following drawings and descriptions. The components in the figures are not necessarily to scale, emphasis instead being placed upon illustrating the principles of the invention. Moreover, in the figures, like reference numerals designate corresponding or similar parts. In the drawings.

DETAILED DESCRIPTION

Figure 1:
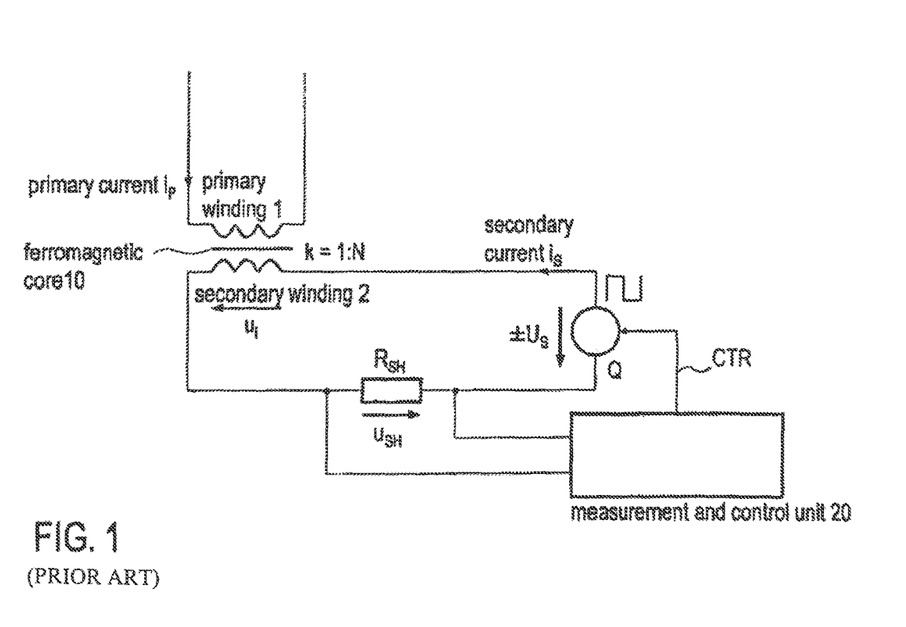
FIG. 1 shows a block diagram of a known current sensor arrangement that operates according to the flux-gate principle.

FIG. 1 illustrates, by means of a block diagram, an example of a flux-gate compensation current sensor without a hysteresis error. The current (primary current $i_P$) to be measured passes through primary winding 1 (primary conductor), which is magnetically coupled to secondary winding 2 (secondary conductor) by a soft magnetic, non-gapped (i.e., having no air gaps) core 10. Primary winding 1 may be composed, for example, of a single winding; i.e., primary winding 1 is formed by a conductor run through core 10 (winding number 1). Secondary winding 2 (with N windings) is connected in series to a controlled voltage source Q, which generates secondary current $i_S$ through the secondary winding. In order to measure secondary current $i_S$, shunt resistor $R_{SH}$ is connected between secondary winding 2 and voltage source Q. Voltage $U_{SH}$ across shunt resistor $R_{SH}$ is supplied to measurement and control device 20, which provides control signal CTR for controlling the controlled voltage source Q.

Figure 2A:
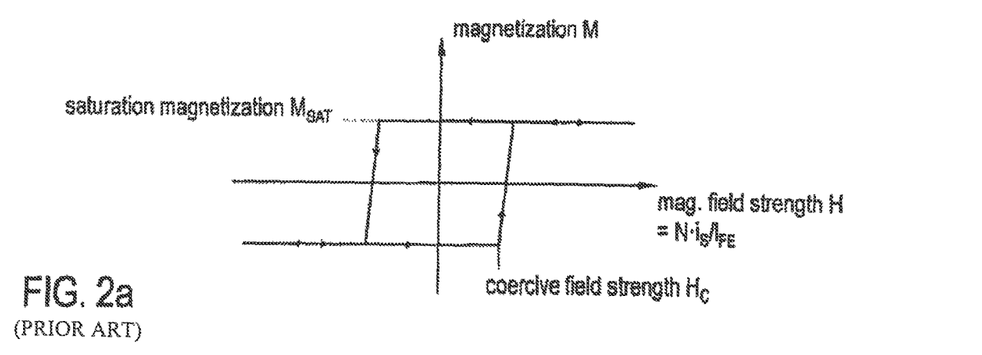
FIGS. 2a and 2b illustrate (idealized) waveforms of the secondary current, of the magnetization and of the magnetic field strength in a freely oscillating current sensor arrangement with a primary current of zero.

The functioning of the current measurement arrangement shown in FIG. 1 is described in the following with reference to FIGS. 2 and 3. FIG. 2a describes the ferromagnetic properties of magnetic core 10 by means of a diagram showing the magnetization characteristics in which magnetic field strength H is entered on the abscissa and magnetization M is entered on the ordinate. The magnetization characteristic has an approximately rectangular hysteresis with a certain coercive field strength $H_C$ and a certain saturation magnetization $M_{SAT}$. According to Ampère's (circuital) law, the (simplified) equation $H=N \cdot i_S/I_{FE}$ applies to magnetic field strength H, wherein the parameter $I_{FE}$ designates the effective length of the path of the magnetic field lines in core 10.

According to Faraday's law, the equation $$u_i = -N \cdot d\Phi/dt = -N \cdot A \cdot dB/dt \quad (1)$$

applies to voltage $u_i$, which is induced in secondary coil 2, wherein the parameter A designates the cross-section area of core 10, the symbol $\Phi$ designates the magnetic flux through core 10 caused by secondary current $i_S$, and the symbol B designates the magnetic flux density. Magnetic flux density B can be generally represented by the relationship $B=\mu_0 \cdot (H+M)$; from this it follows that during the reversal of the magnetization of core 10 (corresponding to the left or right vertical branch of the magnetization characteristic in FIG. 2a), the change rate of magnetization dM/dt is proportional to induced voltage $U_i$, and thereby the magnetic field strength H as well as the secondary current are constant; i.e., $$u_i = -N \cdot A \cdot \mu_0 \cdot dM/dt \text{ (during the reversal of magnetization)}. \quad (2)$$

It can also be said that the differential inductance of secondary coil 2 is almost infinitely high during the reversal of magnetization. As soon as the magnetization in core 10 has achieved saturation magnetization $M_{SAT}$, secondary current $i_S$ rises and is then only limited by the ohmic resistance of secondary winding 2 and shunt resistor $R_{SH}$.

Figure 2B:
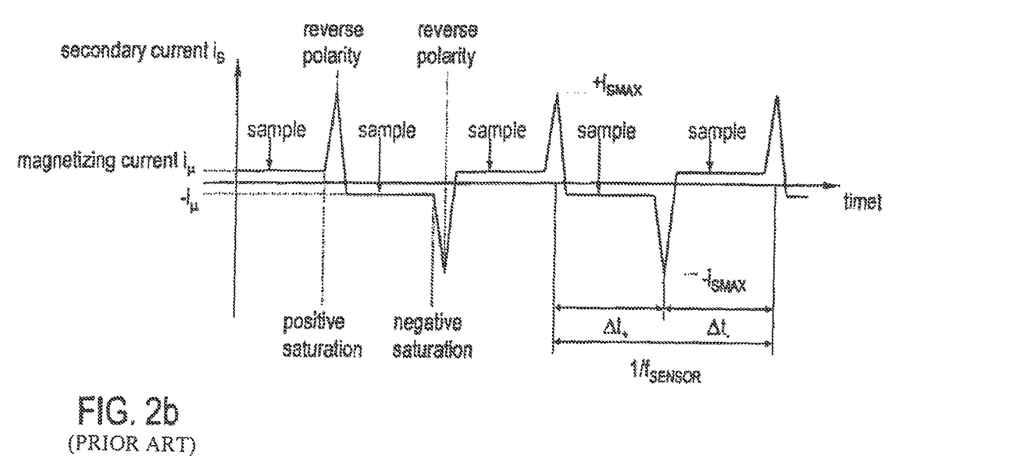

The rise of secondary current $i_S$ is detected by measurement and control unit 20 by using, for example, comparators (cf. FIG. 2b). As soon as the secondary current exceeds positive threshold value $+i_{SMAX}$ or drops below negative threshold value $-i_{SMAX}$, measurement and control unit 20 generates a corresponding control signal CTR in order to reverse the polarity of voltage source Q and trigger the next cycle of magnetization reversal.

The secondary current's course through time (for a primary current $i_P$ of zero) is shown in FIG. 2b. During the reversal of magnetization (cf. the approximately vertical branches of the magnetization characteristic in FIG. 2a), the secondary current is constant and corresponds to magnetization currents $+i_\mu$ and $-i_\mu$. The magnitude of magnetization current $i_\mu$ is a function of the width of the hysteresis in the magnetization characteristic and is thus also a function of coercive field strength $H_C$; i.e., $i_\mu = I_{FE}/N \cdot H_C$. As soon as the magnetization in core 10 achieves positive or negative saturation, the secondary current $i_S$ begins to rise, as already described above. Due to the symmetry of the characteristic hysteresis curve, the waveform of secondary current $i_S$ is also symmetric around an average current value.

Figure 3A:
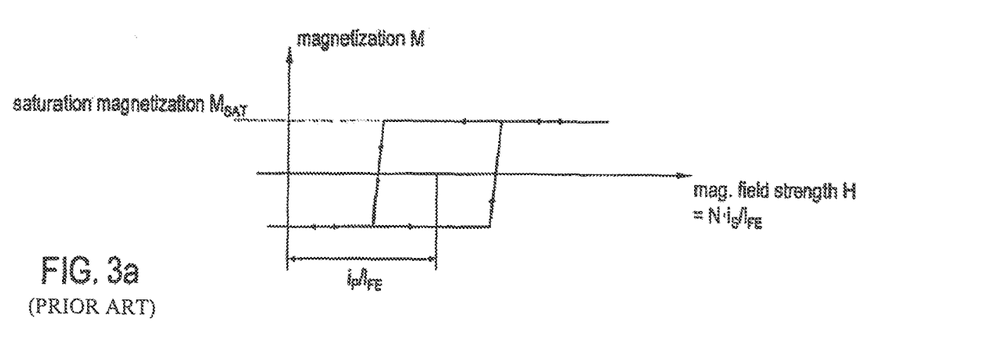
FIGS. 3a and 3b illustrate (idealized) waveforms of the secondary current, of the magnetization and of the magnetic field strength in a freely oscillating current arrangement with a primary current greater than zero.
Figure 3B:
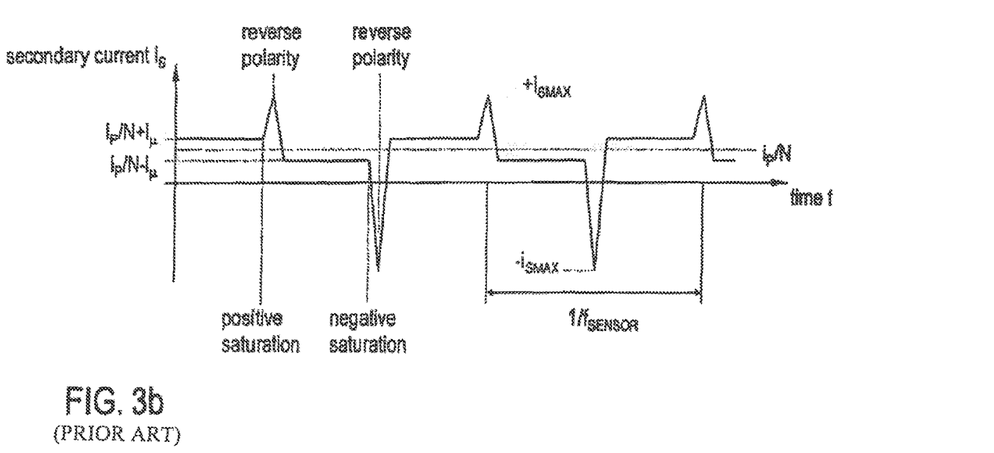

FIGS. 3a and 3b show the same situation as FIGS. 2a and 2b except that primary current $i_P$ is not equal to zero. The magnetic field caused by primary current $i_P$ is superposed in an additive manner in the soft magnetic core 10 with the magnetic field caused by secondary current $i_S$, which can be regarded as a shift of the magnetization characteristic along the abscissa. This situation is graphically represented in FIG. 3a. The corresponding waveform of the secondary current is represented in FIG. 3b. This is similar to FIG. 2b, in which the primary current is zero, with the difference that the secondary current is not symmetrical around the abscissa ($i_S=0$) but is rather symmetrical around the horizontal straight line ($i_S=i_P/N$). This means that during the reversal of the magnetization, the primary current and the secondary current have the same ratio k=1:N as the ratio of numbers of windings of primary winding 1 and secondary winding 2, respectively, disregarding the hysteresis offset at the level of magnetization current $i_\mu$. For the current measurement, secondary current signal $i_S$, or more precisely voltage signal $U_{SH}$ across shunt resistor $R_{SH}$, is sampled during the process of magnetization reversal. That way, a measured current value of $i_S[n-1]=(i_P/N)+i_\mu$ is obtained by sampling the secondary current signal in the first half of a period of the secondary current (measuring cycle); in the second half of the period, a measured current value of $i_S[n]=(i_P/N)-i_\mu$ is obtained. The hysteresis error caused by magnetization current $i_\mu$ can be eliminated by the formation of the average value; the primary current at sampling time instant n is calculated as follows:

$$i_P[n] = N \cdot (i_S[n-1] + i_S[n])/2. \quad (3)$$

As the hysteresis of the magnetization characteristic has no influence on the measured result, this current measuring method is very well suited to measuring very small currents. The measuring range extends from a few milliamperes to one kiloampere. During the magnetization reversal process in core 10, secondary current $i_S$ follows primary current $i_P$ in accordance with the transfer ratio 1:k. The secondary current is sampled at least once during a magnetization reversal process in order to obtain measured values ($i_S+i_\mu$ and $i_S-i_\mu$) to calculate the primary current. However, during the reversal of magnetization, the sampling can also be carried out repeatedly with a sampling rate that is considerably higher than the sensor's oscillating frequency $f_{SENSOR}$. Secondary current $i_S$, equal to $(i_P/N)\pm i_\mu$, is approximately constant during the reversal of magnetization and prior to the occurrence of magnetic saturation in core 10. This idealized consideration is applicable when the hysteresis characteristic of magnetic core 10 is approximately rectangular.

Figure 4:
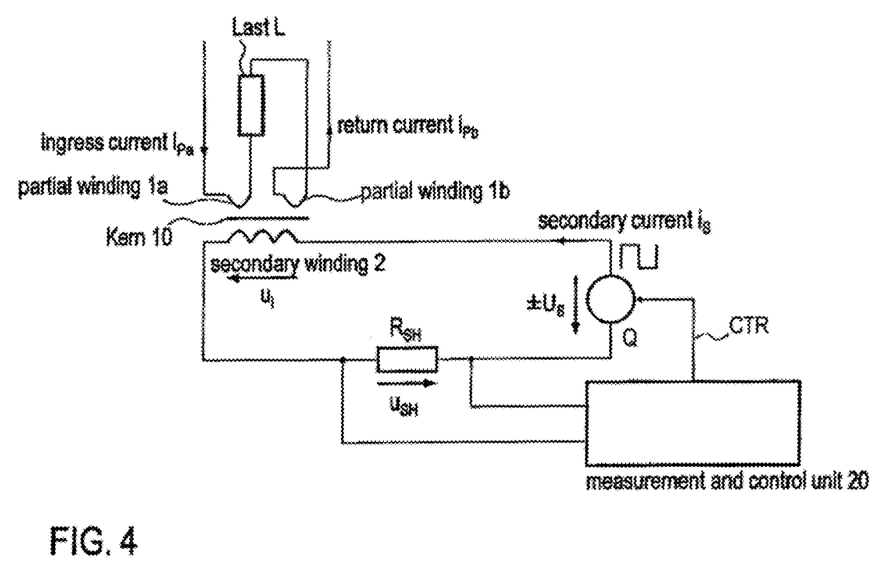
FIG. 4 illustrates a sensor arrangement for measuring a current difference (residual current) similar to the sensor arrangement according to FIG. 1.

The measuring principle previously explained with reference to FIGS. 1 to 3 can also be used to measure differential current (i.e., residual current) with only a minor modification to the sensor construction shown in FIG. 1. Differential currents are measured, for example, in residual-current circuit breakers. For the purpose of differential current measurement, a first partial winding 1a and at least one second partial winding 1b are coupled to core 10 instead of one primary winding 1. The primary current through the first partial winding 1a is denoted by $i_{Pa}$ (ingress winding), and the primary current through the second partial winding 1b (return winding) is denoted by $I_{Pb}$. The partial windings may be composed of only a single winding and are oriented such that the magnetic fields caused by currents $i_{Pa}$ and $i_{Pb}$ compensate (destructively superpose) one another at least partially and only the net primary current $i_{Pa}-i_{Pb}$ (effective primary current) generates a corresponding net magnetic field in core 10 (which is superposed with the magnetic field of secondary current $i_S$). The aforementioned modified sensor setup is shown in FIG. 4 and is substantially identical to the setup of FIG. 1 except for primary winding 1. In the example shown in FIG. 4, the two partial windings 1a and 1b are connected upstream and downstream of load L so that the difference $i_{Pa}-i_{Pb}$ is only unequal to zero when a leakage current is drained in the load that corresponds to this difference. The differential current (effective primary current) is calculated from the sampled values of the secondary current, similar to Equation 3, as follows:

$$\Delta i_P[n]=i_{Pa}[n]-i_{Pb}[n]=N\cdot(i_S[n-1]+i_S[n])/2. \quad (4)$$

The time intervals $\Delta t+$ and $\Delta t-$ (cf. FIG. 2b) are not constant but are rather functions of the magnitude of the primary current. It can be seen from Equation 2 that the speed of magnetization reversal is greater the higher amplitude $U_S$ of the voltage generated by voltage source Q is, because it follows from Eq. 2 that $$dM/dt=-u_L/(N\cdot A\cdot\mu_0)=-(U_S-R_{SH}\cdot i_S)/(N\cdot A\cdot\mu_0) \quad (5)$$

Consequently, the oscillation frequency of the secondary current is higher the higher amplitude $U_S$ of the voltage generated by voltage source Q is. The sensor's oscillation frequency $f_{SENSOR}$ follows from Eq. 5:

$$f_{SENSOR}=1/(\Delta t_++\Delta t_-), \quad (6a)$$

wherein $$\Delta t_+=(\mu_0\cdot\Delta M\cdot N\cdot A)/(U_S-i_S\cdot R_{SH}) \text{ and} \quad (6b)$$

$$\Delta t_-=(\mu_0\cdot\Delta M\cdot N\cdot A)/(U_S+i_S\cdot R_{SH}). \quad (6c)$$

The parameter $\Delta M$ represents the magnetization swing during the magnetization reversal process. It can be seen from Equations 6a to 6c that the sensor's oscillation frequency $f_{SENSOR}$ is a function of the primary current itself, of voltage amplitude $U_S$ of the voltage generated by voltage source Q, and of magnetization swing $\Delta M$.

Particularly in the case of differential current sensors, the geometric arrangement of the primary conductors relative to magnetic core 10 is asymmetric, and a complete cancelling of the resulting magnetic field does not occur, even if the difference $i_{Pa}-i_{Pb}$ is zero. This results in local magnetic saturations in magnetic core 10, which entails a diminution in the effective cross-sectional area A of core 10. This results in modulation of time spans $\Delta t_+$ and $\Delta t_-$. This modulation is periodic and depends on frequency $f_P$ of primary current $i_P$. This effect can also be derived from Equations 6b and 6c if it is assumed that cross-sectional area A varies periodically with frequency $f_P$ of primary currents $i_{Pa}$ and $i_{Pb}$.

In order to measure the frequency of the primary current, measurement and control unit 20 can be configured to regularly sample secondary current $i_S$ (i.e., measuring signal $u_{SH}$, which represents the secondary current) and to calculate a spectrum from sampled values $i_S[n]$ (e.g., using a fast Fourier transform (FFT) algorithm, if appropriate, with windowing). The spectrum will have a clear (global) maximum at the sensor's oscillation frequency $f_{SENSOR}$. Two other (local) maximums with significantly lower magnitudes (maximums of the side lobes) are found at frequencies $f_1=f_{SENSOR}-f_P$ and $f_2=f_{SENSOR}+f_P$. Therefore, the sought frequency $f_P$ of the primary current can be determined from frequencies $f_1$ and $f_2$ of the maximums of the first two side lobes according to the following equation, for example:

$$f_P=(f_2-f_1)/2. \quad (7)$$

Figure 5:
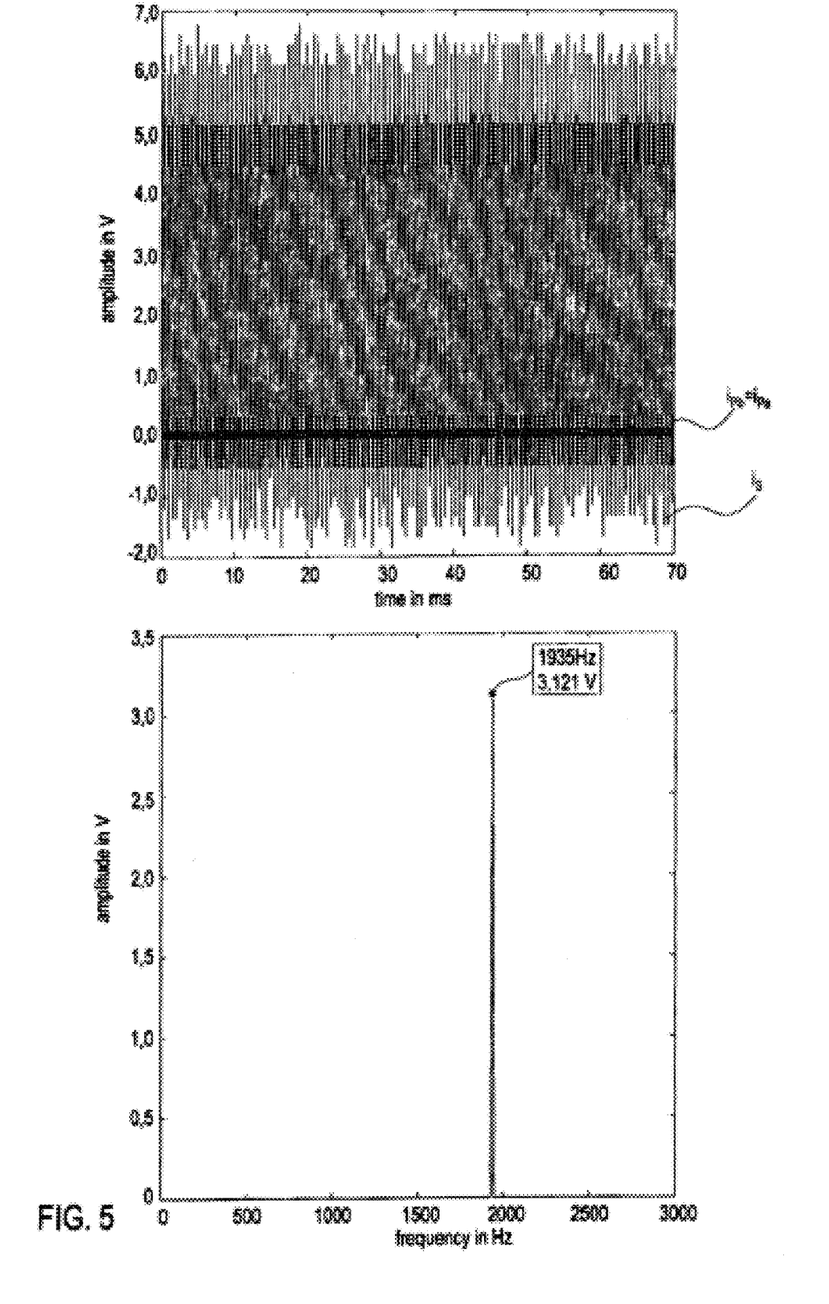
FIG. 5 shows the waveform and the spectrum of the secondary current with zero primary current.
Figure 6:
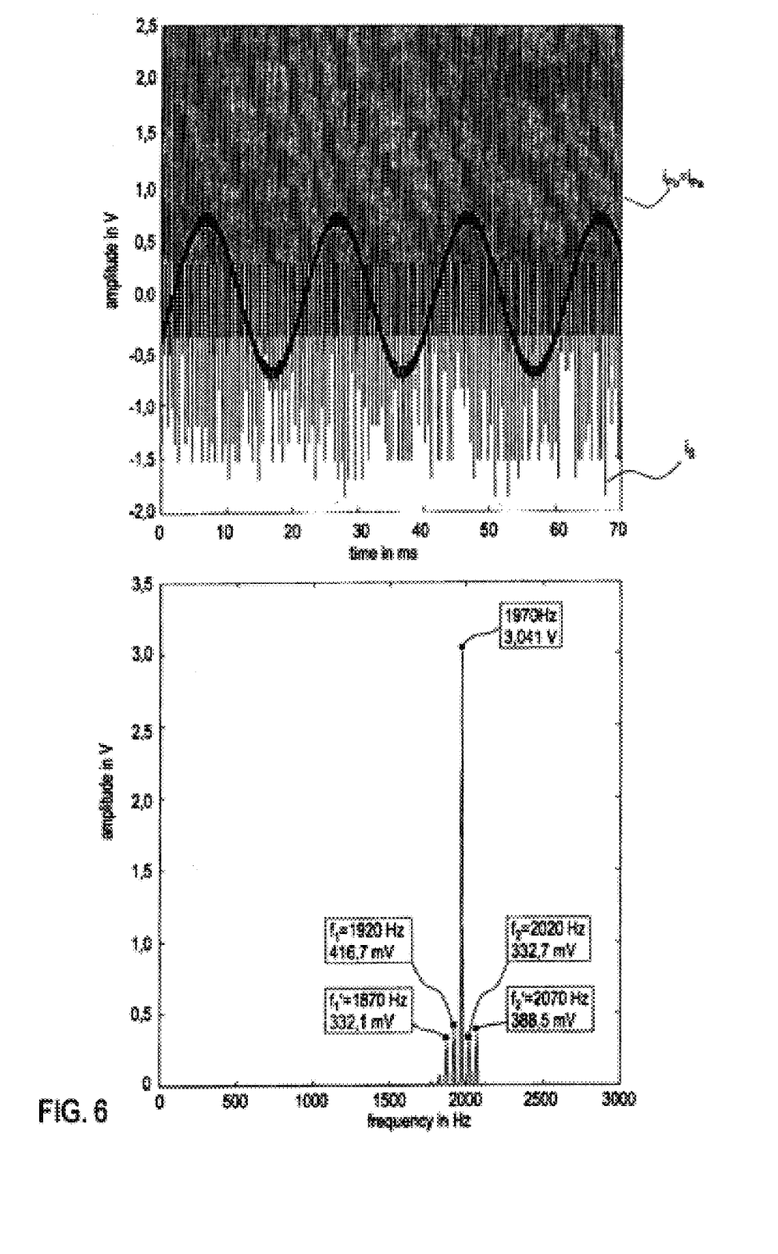
FIG. 6 shows the waveform and the spectrum of the secondary current with a primary current that has a frequency of 50 Hz.

The diagrams in FIGS. 5 and 6 illustrate the aforementioned function of the current sensor. The top diagrams of FIGS. 5 and 6 show a waveform of primary current $i_{Pa}=i_{Pb}$ of a differential current sensor (wherein the differential current $\Delta i_P=i_{Pa}-i_{Pb}=0$) and of the corresponding secondary current $i_S$ over a time of approximately 50 ms. In the case of FIG. 5, primary current $i_{Pa}=i_{Pb}$ is equal to zero; in the case of FIG. 6, the primary current has a sinusoidal course with a frequency $f_P$ of 50 Hz. In both cases, the sensor measures the same differential current $i_{Pa}-i_{Pb}$, namely zero amperes. The bottom diagrams of FIGS. 5 and 6 show the spectrum of secondary current $i_S$ (dependent on primary currents $i_{Pa}$ and $i_{Pb}$). The global maximum of the spectrum is at the current sensor's oscillation frequency $f_{SENSOR}$ (cf. FIG. 2b), which, in the present example, is approximately 2 kHz. In the example shown in FIG. 5, the current sensor's oscillation frequency $f_{SENSOR}$ is 1,935 Hz. In the case shown in FIG. 6, it is 1,970 Hz. The somewhat higher value of the oscillation frequency can be explained in that primary currents $i_{Pa}$ and $i_{Pb}$ cause local saturations in the magnetic core, as a result of which the effective size of cross-sectional area of the core drops. Consequently, the magnetization of the core can be reversed more rapidly and the frequency rises.

If primary currents $i_{Pa}$ and $i_{Pb}$ have no AC component, the global maximum (main lobe) at the current sensor's oscillation frequency $f_{SENSOR}$ is the single significant maximum in the spectrum. However, if primary currents $i_{Pa}$ and $i_{Pb}$ have an AC component, this results in the modulation of the sensor oscillation's cycle period $f_{SENSOR}^{-1}$ (cf. Equation 6a), as explained above. This modulation entails local maximums in the spectrum at frequencies $f_1$ and $f_2$ (first side lobes) and $f_1'$ and $f_2'$ (second side lobes) on both sides of the global maximum at frequency $f_{SENSOR}$. The "distances" $|f_1-f_{SENSOR}|$ and $|f_2-f_{SENSOR}|$ between the frequencies of the two local maximums and the global maximum correspond to frequency $f_P$ of primary currents $i_{Pa}$ and $i_{Pb}$. Frequency interval $f_2-f_1$ corresponds to the double frequency $f_P$ of primary currents $i_{Pa}$ and $i_{Pb}$ (cf. Equation 7). In the example shown in FIG. 6 (when frequency $f_P$ of the primary current is 50 Hz), the calculation according to Equation 7 results in a measured primary current frequency $f_P'$ of (2,020-1,920)/2 Hz=100/2 Hz=50 Hz. Additionally or as an alternative, even the second side lobes can be evaluated at frequencies $f_1'$ and $f_2'$. The second side lobes are twice as far away as the first side lobes from the global maximum at the current sensor's oscillation frequency $f_{SENSOR}$. Therefore, $f_1'=f_{SENSOR}-2 \cdot f_P$ and $f_2'=f_{SENSOR}+2 \cdot f_P$, and $f_1-f_1'=f_P$ and $f_2'-f_2=f_P$.

While various embodiments of the invention have been described, it will be apparent to those of ordinary skill in the art that many more embodiments and implementations are possible within the scope of the invention. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (e.g., that is functionally equivalent), even if not structurally equivalent to the disclosed structure that performs the function in the exemplary implementations of the invention illustrated herein.

We claim:

1. A current sensor arrangement for measuring an effective primary current through a primary conductor; the current sensor arrangement comprises:
    a magnetic core for magnetically coupling the primary conductor to a secondary conductor;
    a controlled voltage source that is coupled to the secondary conductor and is configured to apply a voltage with adjustable polarity to the secondary conductor so that a secondary current having an oscillation frequency passes through the secondary conductor;
    a measurement and control unit coupled to the secondary conductor, the measurement and control unit being configured to: generate a measuring signal that represents the secondary current, to continuously detect an occurrence of magnetic saturation in the core, and to reverse the polarity of the voltage upon the detection thereof in order to reverse the magnetization of the core;
    wherein the measurement and control unit is further configured to evaluate a spectrum of the measuring signal and determine the oscillation frequency of the secondary current flowing through the secondary conductor based on the spectrum and calculate a frequency of the effective primary current passing through the primary conductor using the determined oscillation frequency of the secondary current.

2. The current sensor arrangement of claim 1, wherein the primary conductor comprises a first and a second part, through which a first and a second primary current, respectively, pass in such that the magnetic field strength generated by the primary conductor, and thus the effective primary current, corresponds to the difference of the primary currents.

3. The current sensor arrangement of claim 2, wherein the first part and the second part of the primary conductor are connected upstream and downstream of a load and the difference between the first primary current and the second primary current is only unequal to zero in response to a leakage current being drained in the load that corresponds to the difference between the first primary current and the second primary current.

4. The current sensor arrangement of claim 1, wherein the occurrence of magnetic saturation in the core is detected when the secondary current reaches a defined maximum or minimum value.

5. The current sensor arrangement of claim 1, wherein the measurement and control unit is designed to sample the measuring signal and calculate the spectrum of the measuring signal from the sampled values using an FFT or DFT algorithm.

6. The current sensor arrangement of claim 5, wherein the spectrum has a main lobe at the oscillation frequency of the secondary current as well as two side lobes symmetric to the main lobe, and wherein the frequency of the effective primary current passing through the primary conductor is determined based on the distance between the main lobe and the side lobes or the distance between the two side lobes.

7. The current sensor arrangement of claim 6, wherein the distance between the main lobe and an adjacent side lobe corresponds to the frequency of the effective primary current passing through the primary conductor.

8. A method for measuring an effective primary current through a primary conductor that is magnetically coupled to a secondary conductor by means of a magnetic core; wherein the method comprises:
    applying a voltage to the secondary conductor so that a secondary current passes through the secondary conductor;
    generating a measuring signal that represents the secondary current;
    continuously detecting occurrences of magnetic saturation in the core and reversing the polarity of the voltage upon detection thereof in order to reverse the magnetization of the core; and
    evaluating a spectrum of the measuring signal and determining a frequency of the effective primary current passing through the primary conductor based on the spectrum of the measuring signal.

9. The method of claim 8, wherein the primary conductor comprises first and second parts through which first and second primary currents respectively pass in such a manner that the magnetic field strength generated by the primary conductor and the effective primary current correspond to the difference of the primary currents.

10. The method of claim 8, wherein the occurrence of magnetic saturation in the core is detected when the secondary current achieves a defined maximum or minimum value.

11. The method of claim 8, wherein the evaluation of a spectrum of the measuring signal comprises the following:
    sampling the measuring signal; and
    calculating a digital spectrum of the measuring signal from the scanned values of the measuring signal.

12. The method of claim 11, wherein the evaluation of a spectrum of the measuring signal further comprises the following:
    identifying a main lobe in the digital spectrum at the oscillation frequency of the secondary current and two side lobes symmetric to the main lobe; and
    determining the frequency of the effective primary current passing through the primary conductor using at least one of the distance between the main lobe and the side lobes and the distance between the two side lobes.

* * * * *